United States Patent
Cox (10) Patent No.: US 9,562,938 B2
(45) Date of Patent: Feb. 7, 2017

(54) METHOD AND SYSTEM TO DETECT AND CHARACTERIZE ELECTROMAGNETIC PULSES FOR THE PROTECTION OF CRITICAL INFRASTRUCTURE COMPONENTS

(71) Applicant: Raytheon Company, Waltham, MA (US)

(72) Inventor: Donald Cox, Oro Valley, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 647 days.

(21) Appl. No.: 14/274,188

(22) Filed: May 9, 2014

(65) Prior Publication Data

US 2016/0231367 A1    Aug. 11, 2016

(51) Int. Cl.
*G01R 31/02* (2006.01)
*G01R 29/08* (2006.01)
*G01R 31/00* (2006.01)
*G05B 9/02* (2006.01)

(52) U.S. Cl.
CPC ......... *G01R 29/0814* (2013.01); *G01R 31/001* (2013.01); *G05B 9/02* (2013.01)

(58) Field of Classification Search
USPC .......................................................... 324/72
See application file for complete search history.

(56) References Cited

U.S. PATENT DOCUMENTS

| | | | | |
|---|---|---|---|---|
| 4,328,461 A | * | 5/1982 | Butters | G01R 15/144 324/72 |
| 5,278,562 A | * | 1/1994 | Martin | H01Q 17/007 342/1 |
| 5,294,075 A | * | 3/1994 | Vertatschitsch | G01S 17/32 244/1 R |
| 5,673,028 A | * | 9/1997 | Levy | G01D 7/005 116/209 |
| 8,063,813 B1 | * | 11/2011 | Keller | F41H 11/136 340/572.2 |
| 2005/0122118 A1 | * | 6/2005 | Zank | G01D 9/005 324/457 |
| 2007/0052425 A1 | * | 3/2007 | Kraz | G01R 31/001 324/457 |

(Continued)

OTHER PUBLICATIONS

Kappenman, J.; "Geomagnetic Storms and Their Impacts on the U.S. Power Grid"; Metatech; Meta-R-319; 2010; 197 p.

(Continued)

*Primary Examiner* — Ronald W Leja (57) ABSTRACT

A system and method are proposed to protect critical infrastructure assets from an electromagnetic pulse event. Detonation of a nuclear warhead or geomagnetic storms created by solar corona ejecta or an attack by directed energy weapons can create an electromagnetic pulse event. Several embodiments are disclosed that use radio frequency (RF) sensors, electrostatic discharge sensors and geomagnetic sensors that feed sensor signals to an event characterization and detection unit that analyzes and predicts early occurrence of an electromagnetic pulse event. Critical sensor signals are recorded for future use and are used to refine autonomic algorithms used to predict future electromagnetic pulse events from the sensor data.

21 Claims, 11 Drawing Sheets

(56) References Cited

U.S. PATENT DOCUMENTS

| | | | |
|---|---|---|---|
| 2007/0138275 A1* | 6/2007 | Hall | G05B 19/00 235/400 |
| 2007/0298724 A1* | 12/2007 | Sulkowski, Jr. | G01R 29/0814 455/67.13 |
| 2009/0234619 A1* | 9/2009 | Iwanami | G01R 29/0878 702/199 |
| 2011/0066297 A1* | 3/2011 | Saberi | F16K 31/046 700/287 |
| 2011/0092181 A1* | 4/2011 | Jackson | G01R 29/0814 455/341 |
| 2012/0019962 A1* | 1/2012 | Faxvog | H02H 3/52 361/1 |
| 2013/0255405 A1* | 10/2013 | Brumley | G09B 25/04 73/865.6 |
| 2013/0285671 A1* | 10/2013 | Hoffman | G01R 31/027 324/547 |
| 2013/0308229 A1* | 11/2013 | Faxvog | H02H 7/04 361/35 |
| 2014/0008119 A1* | 1/2014 | Brandt | H05K 9/0073 174/382 |
| 2014/0062312 A1* | 3/2014 | Reed | H05B 37/0218 315/158 |
| 2015/0029632 A1* | 1/2015 | Schill, Jr. | H02H 5/005 361/112 |
| 2015/0123672 A1* | 5/2015 | Ao | G01R 31/001 324/512 |
| 2015/0241493 A1* | 8/2015 | Canne | G01R 31/002 324/612 |
| 2015/0311697 A1* | 10/2015 | Faxvog | H02H 9/08 361/35 |
| 2016/0126738 A1* | 5/2016 | Moore | H02J 3/18 361/35 |
| 2016/0202307 A1* | 7/2016 | Higgins | G05B 23/0272 702/59 |
| 2016/0231367 A1* | 8/2016 | Cox | G01R 29/0814 |

OTHER PUBLICATIONS

Savage et al.; "The Early-Time (E1) High-Altitude Electromagnetic Pulse (HEMP) and its Impact on the U.S. Power Grid"; Metatech; Meta-R-320; 2010; 168 p.

Gilbert, et al.; "The Late-Time (E3) High-Altitude Electromagnetic Pulse (HEMP) and its Impact on the U.S. Power Grid"; Metatech; Meta-R-321; 2010; 155 p.

Kappenman, J.; "Low-Frequency Protection Concepts for the Electric Power Grid: Geomagnetically Induced Current (GIC) and E3 HEMP Mitigation"; Metatech; Meta-R-322; 2010; 98 p.

Radasky, et al.; "Intentional Electromagnetic Interference (IEMI) and its Impact on the U.S. Power Grid"; Metatech; Meta-R-323; 2010; 53 p.

Radasky, et al.; "High-Frequency Protection Concepts for the Electric Power Grid"; Metatech; Meta-R-324; 2010; 42 p.

* cited by examiner

METHOD AND SYSTEM TO DETECT AND CHARACTERIZE ELECTROMAGNETIC PULSES FOR THE PROTECTION OF CRITICAL INFRASTRUCTURE COMPONENTS

TECHNICAL FIELD

The present disclosure is directed in general to infrastructure protection systems and in particular to a method and system to detect and characterize electromagnetic pulses for the protection of critical infrastructure components.

BACKGROUND OF THE DISCLOSURE

The critical infrastructures of modern civilizations need protection from catastrophic events such as a detonation of a nuclear warhead, solar corona ejecta or an attack by directed energy weapons. Power and telecommunication systems serve as the backbone of modern infrastructure elements because components of these critical infrastructures depend on computerized control and communication systems, which are inoperable without requisite power and communication capabilities. Accordingly, protection of these critical assets and quick recovery from such a catastrophic event are of utmost national importance.

SUMMARY OF THE DISCLOSURE

To address one or more of the above-identified problems and deficiencies of the prior art, embodiments are disclosed in this disclosure that provide for a more accurate characterization and detection of impending occurrence of catastrophic events that create an electromagnetic pulse event. Upon detection, asset protection systems are activated to prevent or mitigate damage to critical infrastructure components.

According to one embodiment of the disclosure, system and method are proposed to protect critical infrastructure assets from an electromagnetic pulse event. Detonation of a nuclear warhead or geomagnetic storms created by solar corona ejecta or an attack by directed energy weapons can create an electromagnetic pulse event. Several embodiments are disclosed that use radio frequency (RF) sensors, electrostatic discharge sensors and geomagnetic sensors that feed sensor signals to an event characterization and detection unit that analyzes and predicts early occurrence of an electromagnetic pulse event. Critical sensor signals are recorded for future use and to refine autonomic algorithms used to predict future electromagnetic pulse events from the sensor data.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

It should be understood at the outset that, although example embodiments are illustrated below, the present invention may be implemented using any number of techniques, whether currently known or not. The present invention should in no way be limited to the example implementations, drawings, and techniques illustrated below. Additionally, the drawings are not necessarily drawn to scale.

The critical infrastructures of western civilizations are dependent upon computerized control systems, which in turn depend on complete availability of stable electric power and telecommunications facilities. The infrastructure assets must be protected from an Electromagnetic Pulse (EMP) event created by the electromagnetic and geomagnetic energy from an exoatmospheric detonation of a nuclear warhead, a solar corona ejecta, or an attack by directed energy weapons so to avoid destruction or disruption to the electric power and telecommunication infrastructures. Such destruction or disruption to the electric and telecommunication infrastructures would precipitate the breakdown of societal control and result in significant loss of productivity and impact the Gross National Product (GNP) for years to come.

Accordingly, certain embodiment of the disclosure provide a system and method to prevent or mitigate damage to computerized control systems and infrastructure components by detecting the early occurrence of catastrophic events and activating protection systems in time to prevent damage.

Research in this area by government, academic and industry sectors have advanced several protection systems that can shut off critical infrastructure components. However, the unresolved issue has been determining when to reliably trigger these protection systems. Existing crude methods have significant false positives rendering them unusable, resulting in unwanted power and telecommunication shutdowns affecting the lives of millions of people.

As disclosed herein, certain embodiment of the disclosure use a combination of Radio Frequency (RF) sensors, electrostatic discharge (ESD) sensors, and geomagnetic (GM) sensors along with autonomic algorithms to characterize and detect occurrences of an Electromagnetic Pulse event. When such an occurrence is detected, these embodiments trigger the asset protection systems to prevent damage. The sensor data collected leading to and during the catastrophic events is recorded and used to tune the autonomic algorithms and to prune a decision subsystem for use in subsequent event detection.

One or more embodiments of the disclosure may perform one or more of the following:
  (1) selection, combination, and integration of RF, ESD, and GM sensors to characterize the features of the electromagnetic and geomagnetic signature of an EMP event that are indicative precursors to a catastrophic event;
  (2) autonomic algorithms for EMP sensor data reduction and analysis;
  (3) use of monotonic and polytonic predicate calculus to accurately identify an EMP event created by a nuclear exoatmospheric detonation, a solar geomagnetic storm, a non-nuclear direct energy weapon, or combinations thereof;
  (4) cataloging and unique configurations of the EMP sensors and data processing and asset protection elements;
  (5) application of monotonic and polytonic predicate calculus and autonomic algorithms for identification of an EMP event and collection of data; and
  (6) collection and preservation of localized EMP event sensor data and data processing history for forensic analysis.

Figure 1:
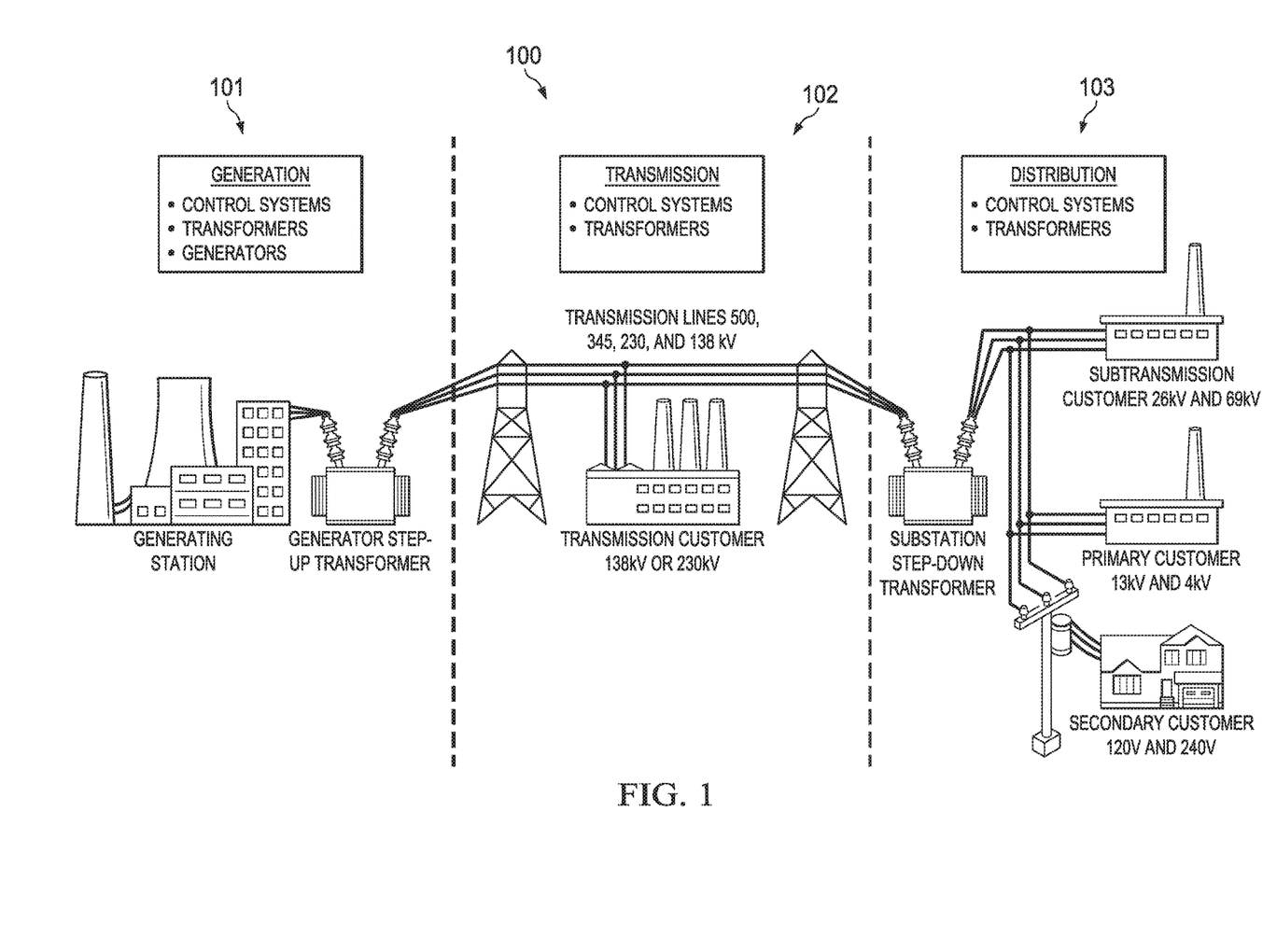
FIG. 1 illustrates a typical power infrastructure system with generation components, transmission components, and distribution components that collectively are used for the delivery of electric power.

FIG. 1 illustrates a typical power infrastructure system 100 with generation components 101, transmission components 102, and distribution components 103 that collectively are used for the delivery of electric power. The generation components 101 typically include control systems, transformers and generators. The generation components 101 are considered critical assets as damage to any of such generation components 101 can take several weeks to months to restore and can cost hundreds of million dollars in damages. The transmission components 102 employ many heavy-duty transformers and are regulated by complex control systems. The distribution components 103 include many medium-size transformers and are also regulated by control systems. As illustrated in FIG. 1, protecting control systems and transformers of various sizes is a major part in preventing and mitigating damages due to a catastrophic event. High altitude electromagnetic pulses (HEMP), geomagnetic storms (GMS) caused by coronal mass ejection (CME), and attack by directed energy weapons (DEW) are considered the three biggest threats to the nation's electric power systems. The secondary impacts of loss of power include major impact to a country's economy and can cost trillions of dollars and several years to recover. Thus, embodiments of this disclosure provided below have a great significance and benefit to a country as a whole.

To protect the critical infrastructure components from HEMP, CME, GMS, and DEW, this disclosure provides several embodiments of a system and methodology as will be provided in greater detail below.

Figure 2:
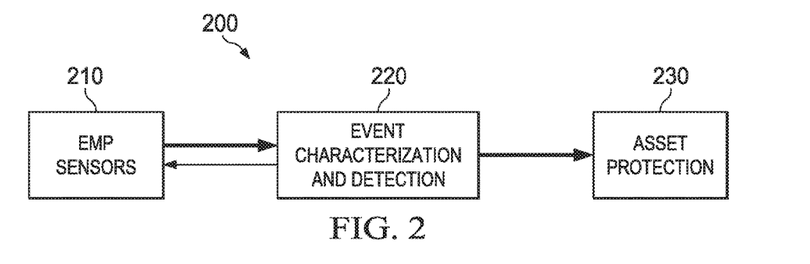
FIG. 2 illustrates a system with three main subsystems according to embodiments of the disclosure.

FIG. 2 illustrates a system 200 with three main subsystems according to embodiments of the disclosure. In particular configurations, these subsystems are co-located at the site where equipment that needs to be protected is located. However, in other configurations, one or more of these subsystems are not on site with the assets to be protected but rather may be located at distances remote from the site with the assets to be protected. The system 200 of FIG. 2 includes an EMP sensor subsystem 210, an Event Characterization and Detection (ECD) subsystem 220, and an Asset Protection (AP) subsystem 230. Although each respective subsystem is labeled as a "subsystem," each respective subsystem may include a plurality of different subsystems directed to different features, some of which are described below.

The EMP sensor subsystem 210 contains various sensors that sense and measure electric fields, magnetic fields and electrostatic fields and energy levels at various frequencies. The EMP sensor subsystem 210 feeds the collected sensor data to the ECD subsystem 220.

The ECD subsystem 220 can analyze, tune and refocus the data from the EMP sensor subsystem 210 in many dimensions, such as frequencies of interest, sensor bias levels or thresholds and spatial location of sensors. In particular configurations, the ECD subsystem 220 can also control the sensors in the EMP sensor subsystem 210. As a non-limiting example, the ECD subsystem 220 can command movement of the sensors in the EMP sensor subsystem 210 to new locations, change sensor configurations, or command the sensors in the EMP sensor subsystem 210 to look in different directions in real time. Yet other manners of controlling the EMP sensors by the ECD subsystem 220 will become apparent to one of ordinary skill in the art after review of this specification.

The ECD subsystem 220 analyzes the data received from the EMP sensor subsystem 210 to detect potential occurrences of EMP/CME/DEW events. The physiognomies of each sensor's waveform (such as strengths, frequencies, time-periods, waveform shapes, etc.) are analyzed and correlated by autonomic algorithms with characteristics of actual and simulated EMP/CME/DEW events to predict the occurrence of various catastrophic events. Using monotonic and polytonic predicate calculus, a "decision" having a high degree of confidence in the accurate identification of an actual EMP/CME/DEW event is calculated. In the case of an actual EMP event, the ECD subsystem 220 sends a valid EMP event message to the AP subsystem 230 as will be discussed in more details below. At the same time, the ECD subsystem 220 records all critical data received from the sensors in the EMP sensor subsystem 210 and the reduction and processing of the data for subsequent forensic analysis. A historical record is created and stored in EMP hardened data repository devices (not shown).

The AP subsystem 230 accepts inputs from the ECD subsystem 220. The configuration of the AP subsystem 230 is generalized as a multiplicity of control elements coupled to protective components that affect the protective measures, such as by grounding conductors, opening a circuit by a circuit breaker, safe shut down of industrial processes, and the like. The configuration of the AP subsystem 230 is as unique as the equipment and processes that are to be protected from EMP assault. Upon receipt of a valid EMP event message (e.g., from the ECD subsystem 220), the AP subsystem 230 activates the protective measures as determined by policies that may be pre-defined by the asset owners and administrators of the system 200. The AP subsystem 230 also generates a forensic data collection concurrent with the activation of the protective steps.

Figure 3:
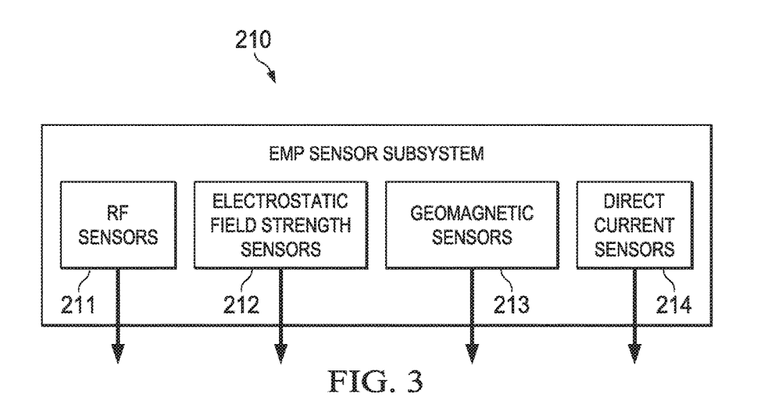
FIG. 3 illustrates further details of an EMP sensor subsystem according to an embodiment of the disclosure.

FIG. 3 illustrates further details of the EMP sensor subsystem 210 according to an embodiment of the disclosure. In this embodiment, the EMP sensor subsystem 210 includes an RF sensor subsystem 211, an ESD sensor subsystem 212, a GM sensor subsystem 213 and a Direct Current (DC) sensor subsystem 214. In one configuration, the RF sensors in the RF sensor subsystem 211 are sensitive to electromagnetic energy having frequencies of 100 KHz through 1 GHz generated by the impact of prompt gamma and X-ray radiation upon the gas molecules within the atmosphere—known as the Compton Scattering effect, geomagnetic storms caused by CME and the effects of DEW. In particular configurations, the ESD sensor subsystem 212 is capable of measuring weak and strong electrostatic field potentials. As one non-limiting example, in one configuration, ESD measurements can be as low as 10V/m2 and as high as 50,000 V/m2, generated by scattered gamma rays and inelastic gammas produced by weapon-originated neutrons. The GM sensor subsystem 213 measures the distortions to the Earth's magnetic fields. As one non-limiting example, in a particular configuration, the GM sensor subsystem 213 uses a set of sensitive magnetometers with a sensitivity of 1 µT (0.01 G) to detect the change in magnetosphere flux caused by an EMP assault that can have magnitudes of 100 µT (1.0 G) and measure the duration and rate of change of the magnetic disturbance. In particular configurations, the DC sensor subsystem 214 measures the induced DC voltage as high as 5,000 volts and DC currents as high as 1,000 amps induced on the high-value assets to be protected. In particular configurations, the sensors (or components in communication therewith) in the subsystems 211, 212 213, and 214 process the respective energy signals into waveforms compatible with the input to the ECD subsystem 220. The detonation of an exoatmospheric nuclear device creates localized plasma that is electrically conductive. This plasma field distorts the Earth's magnetosphere—the magnetic field of the earth—and is capable of inducing electric currents in surface and subsurface infrastructure apparatuses (such as electric power lines and gas pipelines) of magnitudes exceeding 5,000 VDC/m for durations as long as 100 seconds.

As briefly introduced above, the ECD subsystem 220 characterizes the signals received from the EMP sensor subsystem 210 and analyzes such signals to detect occurrences of catastrophic events. The signal analysis looks for characteristics associated with three phases—namely E1, E2 and E3 (described in further details below) that occur in that order—due to a HEMP event or a CME event.

Figure 4:
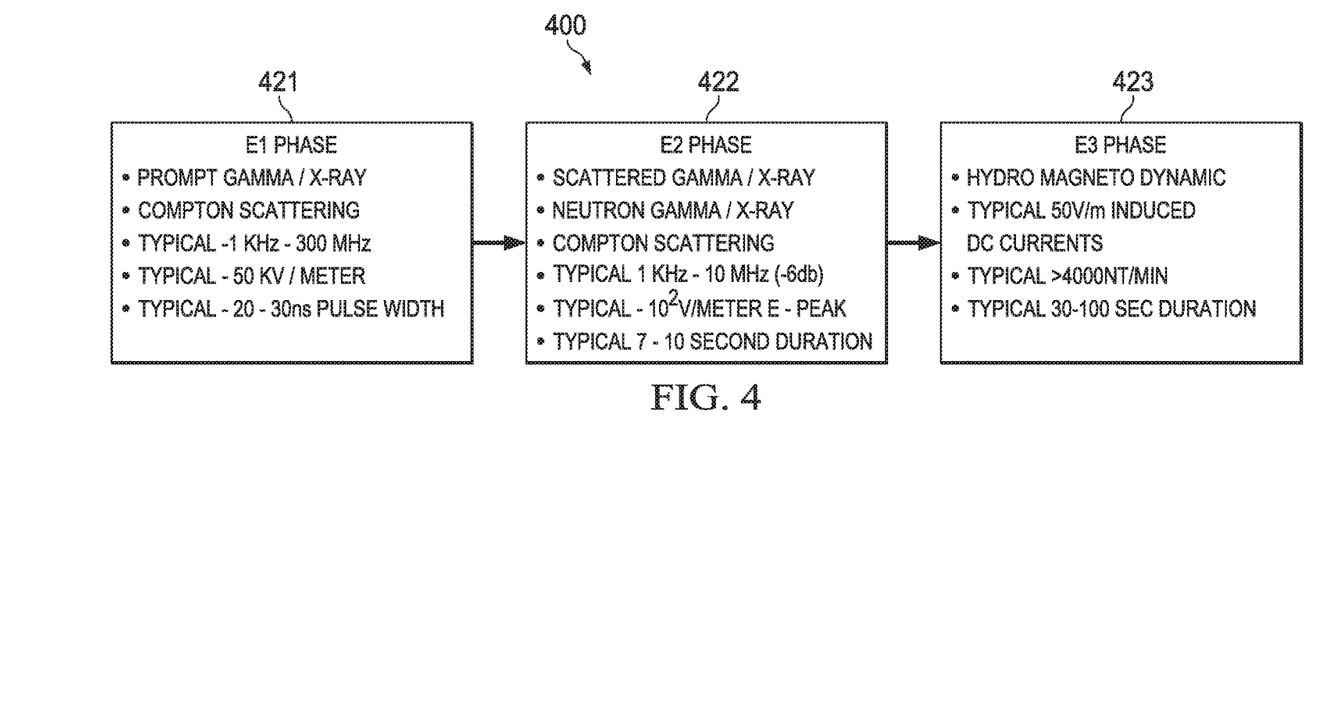
FIG. 4 illustrates sample E1, E2, and E3 characteristics being analyzed by an ECD subsystem according to an embodiment of the disclosure.

FIG. 4 illustrates sample E1, E2, and E3 characteristics being analyzed by the ECD subsystem 220 according to an embodiment of the disclosure. In this embodiment, the ECD subsystem 220 looks for signal characteristics that indicate the start and end of the E1 phase, signal characteristics associated with the start and end of the E2 phase, and signal characteristics associated with the start and end of the E3 phase. In one embodiment, in looking for characteristics of the E1 phase, the ECD subsystem 220 is tuned to detect spectral density exceeding 1 KV/m in the frequency spectrum 1 KHz to 30 MHz with a typical 20 to 30 ns pulse width in the time domain. In this first E1 phase, prompt gamma and X-rays are generated with Compton Scattering prevalent. In this early detection of the E1 phase, the ECD subsystem 220 will command the shutdown (e.g., using appropriate messaging sent to the AP subsystem 230) of critical infrastructure control components such as the Supervisory Control and Data Acquisition (SCADA) systems, Distributed Control Architecture (DCA) systems, and Programmable Logic Controllers (PLCs).

The E2 phase immediately follows the E1 phase and is identified by its typical characteristics of having abundant reduced energy scattered gamma/X-rays, neutron gamma/X-rays resulting in increased Compton Scattering. In one embodiment, the sensors of the sensor subsystem 210 are tuned to detect spectral densities in the 1 KHz to 10 MHz frequency band and identify when the spectral densities exceed 102 V/m (e-peak) and last around 10-7 seconds or more in duration. When the E2 phase is detected, the ECD subsystem 220 may command the AP subsystem 230 to activate additional protection such as passive protection circuits.

The E3 phase follows the E2 phase and is identified by tuning the sensors to detect changes in the amplitude and rate of change of magnetic flux densities. This phase is characterized by the occurrence of Hydro-magneto-dynamic effects. The E3 phase is subdivided into an E3a blast wave and E3b magnetic heaving. In E3a, the blast wave creates plasma resulting in a conductive bubble that distorts the Earth's magnetic field. The distortion and subsequent relaxation of the magnetic bubble result in induced electromagnetic currents on and under the Earth's surface and metallic power conductors. Such induced currents can damage high-voltage and high-current transformers as well as electrical power relays. In one embodiment, the sensors are tuned to detect DC currents induced upon power lines in the order of 50 V/m and a rate of change in magnetic flux densities of equal to or more than 4000 nT (nano-Tesla) per minute lasting for 30 to 1000 seconds in duration. Upon detection of the start of the E3 phase, the subsystem 220 commands the AP subsystem 230 to shut down and isolate or ground high volt-amp transformers and relays.

Figure 5:
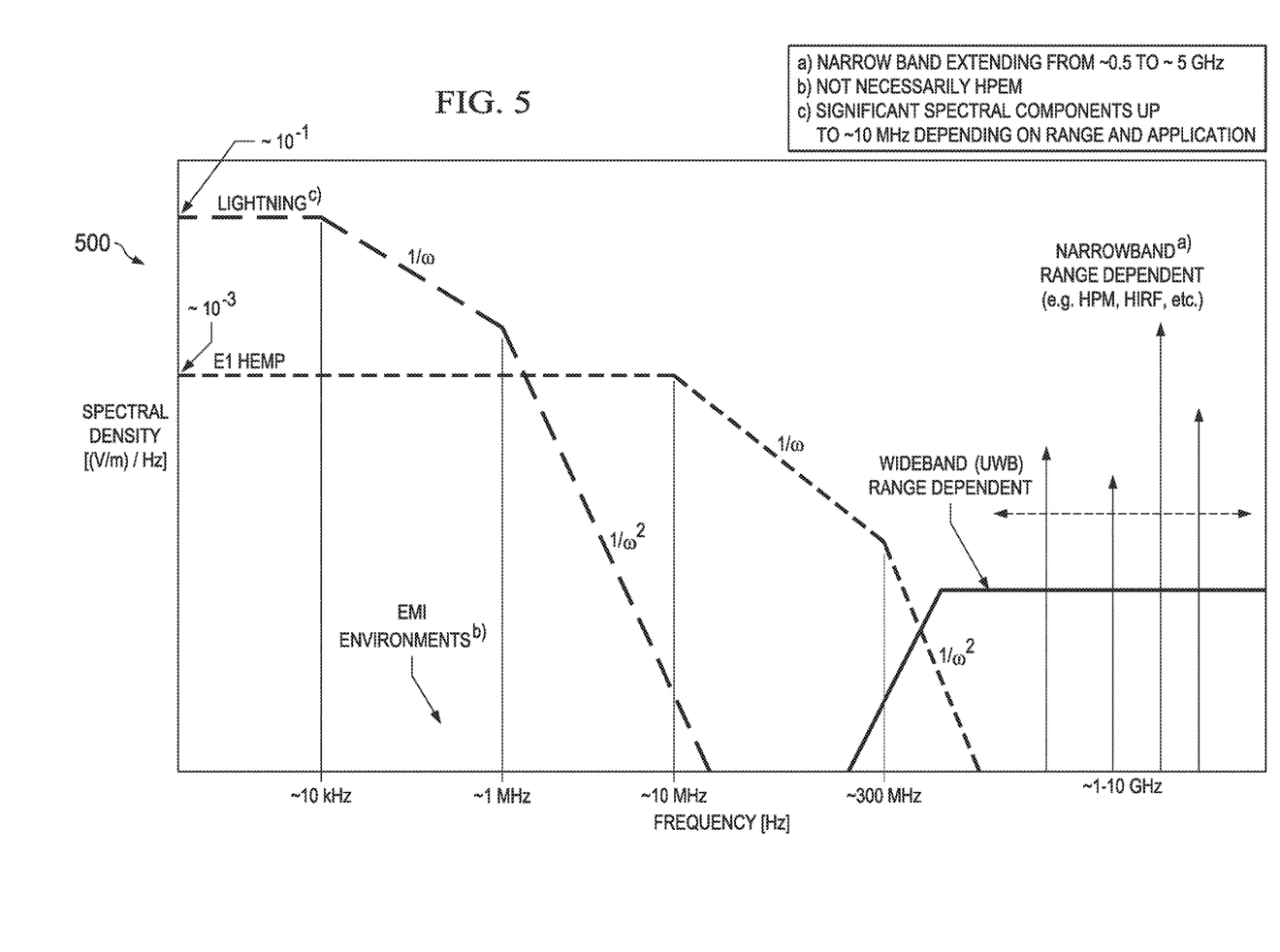
FIG. 5 is a graph with typical characteristics used by the ECD subsystem to distinguish the occurrence of an E1 phase of a HEMP event from a lightning event or from signals emitted by typical narrowband and wideband transmitters according to an embodiment of the disclosure.

FIG. 5 is a graph 500 with typical characteristics used by the ECD subsystem 220 to distinguish the occurrence of an E1 phase of a HEMP event from a lightning event or from signals emitted by typical narrowband and wideband transmitters according to an embodiment of the disclosure. As can be seen, the narrowband signal transmitters have high spectral densities in the 1 to 10 GHZ range, while the wideband transmitters are typically in the 0.5 to 5 GHz range. Lightning events, for example, have much higher spectral densities below 1 MHz and sharply drop down to low values around 10 MHz.

In one embodiment, as illustrated in FIG. 5, the ECD subsystem 220 looks for spectral densities around 10-3 V/m/Hz below 10 MHz, dropping slowly to 10-4 V/m/Hz around 300 MHz before dropping sharply to very low values in the 500 MHz range, thus avoiding the wideband and narrowband transmit ranges.

Figure 6:
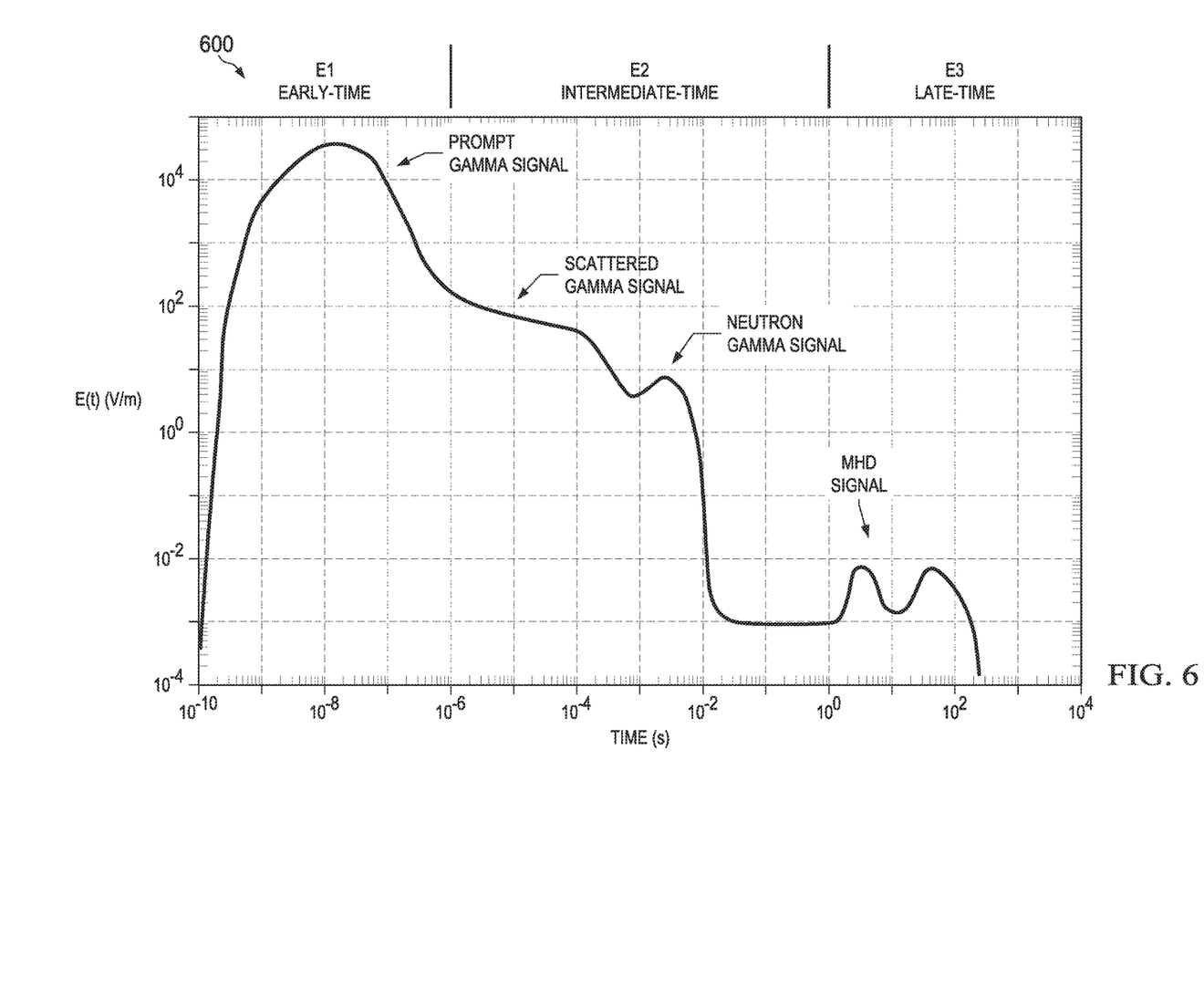
FIG. 6 shows a graph of sample timeline characteristics used by one embodiment of the EMP subsystem.

The ECD subsystem 220 also looks for a duration of electric potentials (V/m) in detecting the start and end of various phases E1, E2 and E3. FIG. 6 shows a graph 600 of sample timeline characteristics used by one embodiment of the ECD subsystem 220. The early E1 phase is characterized by pulse widths in nano-seconds, while the E2 phase is characterized by pulse widths in micro-seconds and the E3 phase lasts for hundreds of seconds. The peak E(t) drops logarithmically from E1 to E2 to E3 as shown in FIG. 6.

Figure 7:
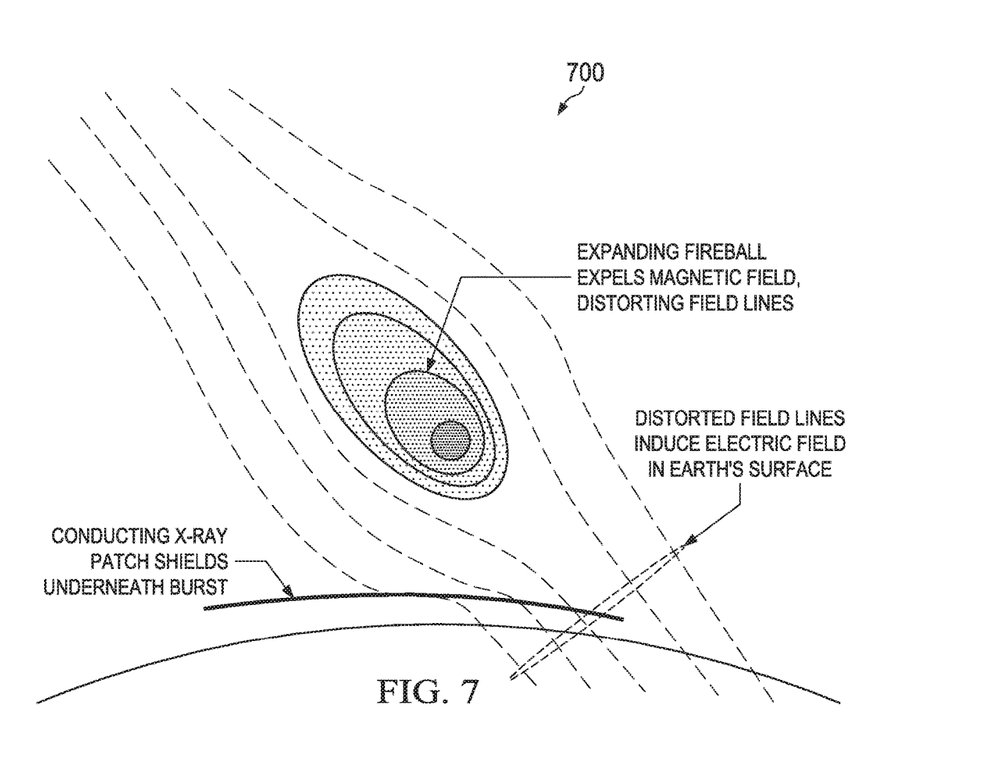
FIG. 7 illustrates an E3a blast wave that creates a very high rate of change in magnetic flux distortions inducing very high surface currents.

The E3 phase includes the E3a phase followed by the E3b phase. The E3a phase is the blast wave that creates a very high rate of change in magnetic flux distortions inducing very high surface currents as shown with an illustration 700 in FIG. 7. In one illustrative embodiment, the sensors of the EMP subsystem 210 are tuned to detect the blast wave with characteristics shown in the illustration 700. In this embodiment, the GM sensors are tuned to detect a rate of change of magnetic flux lines that equal or exceed 4000 nT/min and that last for durations longer than 30 seconds.

Figure 8:
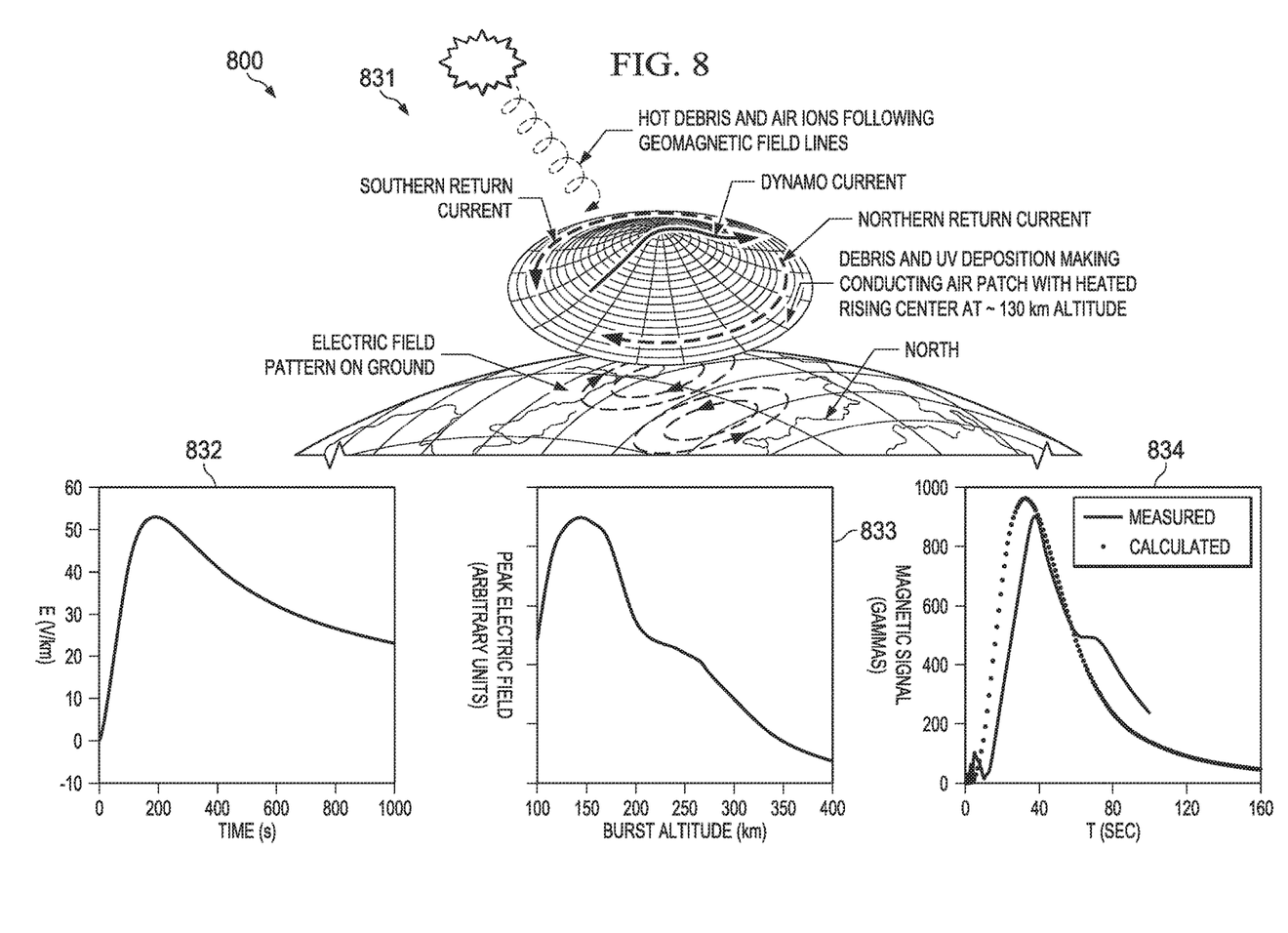
FIG. 8 illustrates an E3b phase characterized by magnetic heave phenomenology where hot debris and air ions follow geomagnetic field lines.

The sensors of the EMP subsystem 210 are tuned to detect the E3b phase characteristics as shown by an illustration 800 in FIG. 8. The E3b phase is characterized by magnetic heave phenomenology, where hot debris and air ions follow geomagnetic field lines. The debris and UV deposition create a conductive air patch in the shape of an umbrella as illustrated in the system 831, with the center rising to about 130 km altitude due to heat. The E3b phase creates conductive electric field patterns down below on the Earth's surface. As shown with reference to graph 832, the sensors are tuned to detect a peak of about 50 V/m in the electric field with a rise time of between 10 to 20 seconds and with a duration lasting for hundreds of seconds (typically 120 to 1000 sec). As shown with graph 833, sensors can be deployed at different heights from the Earth's surface, and the electric field profiles are monitored to detect a peak electric field exceeding 50 V/m at a height of around 130 km from the Earth's surface. As shown with graph 834, magnetometers are tuned to detect rapidly changing magnetic flux, the rate increasing rapidly in the first 40 seconds and decreasing thereafter and returning to slow rates of change after about 160 seconds or so after start of the occurrence.

The ECD subsystem 220 not only characterizes and analyzes the signals received from the EMP sensor subsystem 210, but the ECD subsystem 220 also tunes and sets sensitivities, frequency and waveform characterization parameters for the EMP sensor subsystem 210.

Figure 9:
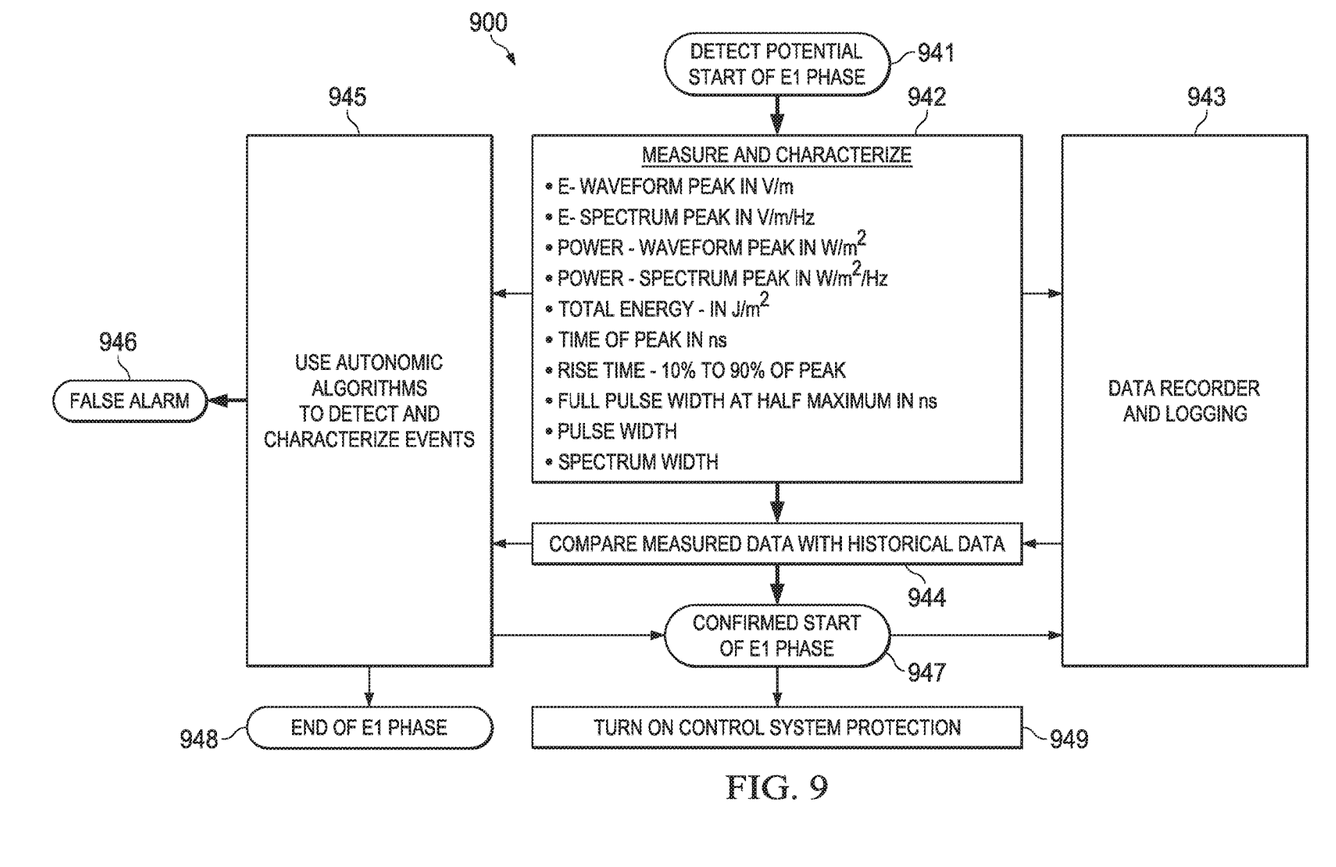
FIG. 9 shows an operation of the ECD subsystem handling the E1 phase according to an embodiment of the disclosure.

FIGS. 9 through 12 illustrate the interactions between various subsystems and the methods used by ECD subsystem 220 in detecting the start of various phases E1 through E3. FIG. 9 shows an operation 900 of the ECD subsystem 220 in handling the E1 phase according to an embodiment of the disclosure. As shown, the operation 900 involves the use of an E1 signal analysis unit 942, an E1 data recording unit 943, an E1 signal comparator unit 944, an E1 computing unit 945 and an E1 asset protection command unit 949.

FIG. 9 also shows a triggering sequence of certain events. The ECD subsystem 220 starts at a monitoring state (941), where the ECD subsystem 220 continuously monitors a set of key parameters that are characteristics of an early E1 phase. For example, in one configuration, the ECD subsystem 220 may sense an indication of rising electric spectral densities in the frequency band of 1 KHz to 300 MHz. When this rise in spectral density is detected, the ECD subsystem 220 transitions from the monitoring mode and commands certain sensors in the EMP sensor subsystem 210 to sense various waveform characteristics at various frequencies. Various waveform parameters are measured and calculated by the E1 signal analysis unit 942, such as measuring the peak V/m of the E waveform, the E spectrum peak in V/m/Hz, the waveform power peak in W/m, the spectrum peak power in W/m/Hz, the total energy in J/m2, the rise time to peak and duration of peak, the full pulse width at half maximum in nano-seconds, and the pulse width and spectrum bandwidth.

The ECD subsystem 220, while continuing to measure these waveform characteristics, also provides the data to the data recording unit 943, which turns on the recording of key parameters. The ECD subsystem 220 then commands the comparator unit 944 to compare current sensor data with historical data supplied by the recording unit 943 and with preprogrammed limits. The results of the comparisons are passed to the E1 computing unit 945, which uses monotonic and polytonic predicate calculus and autonomic algorithms to detect and characterize various events. There are various types of autonomic algorithms that are known or will become apparent to one of ordinary skills in this art having read this specification. Hence, in the interest of brevity, these are not described herein. These algorithms use historical data to analyze and detect signal characteristics with simulated and measured historical data and self-refine them with time based on true positives and false positives. When a false positive is detected, the ECD subsystem 220 signals a false alarm (946). If the ECD subsystem 220 detects a true E1 event, the subsystem 220 confirms the start of the E1 event (947). When the ECD subsystem 220 detects the end of the E1 phase, the subsystem 220 signals that the E1 phase has ended (948) and starts the E2 phase. A confirmed start of the E1 phase also initiates the processes of the E1 asset protection command unit 949, which may include sending messages to the E1 portions of the AP subsystem 230.

Figure 10:
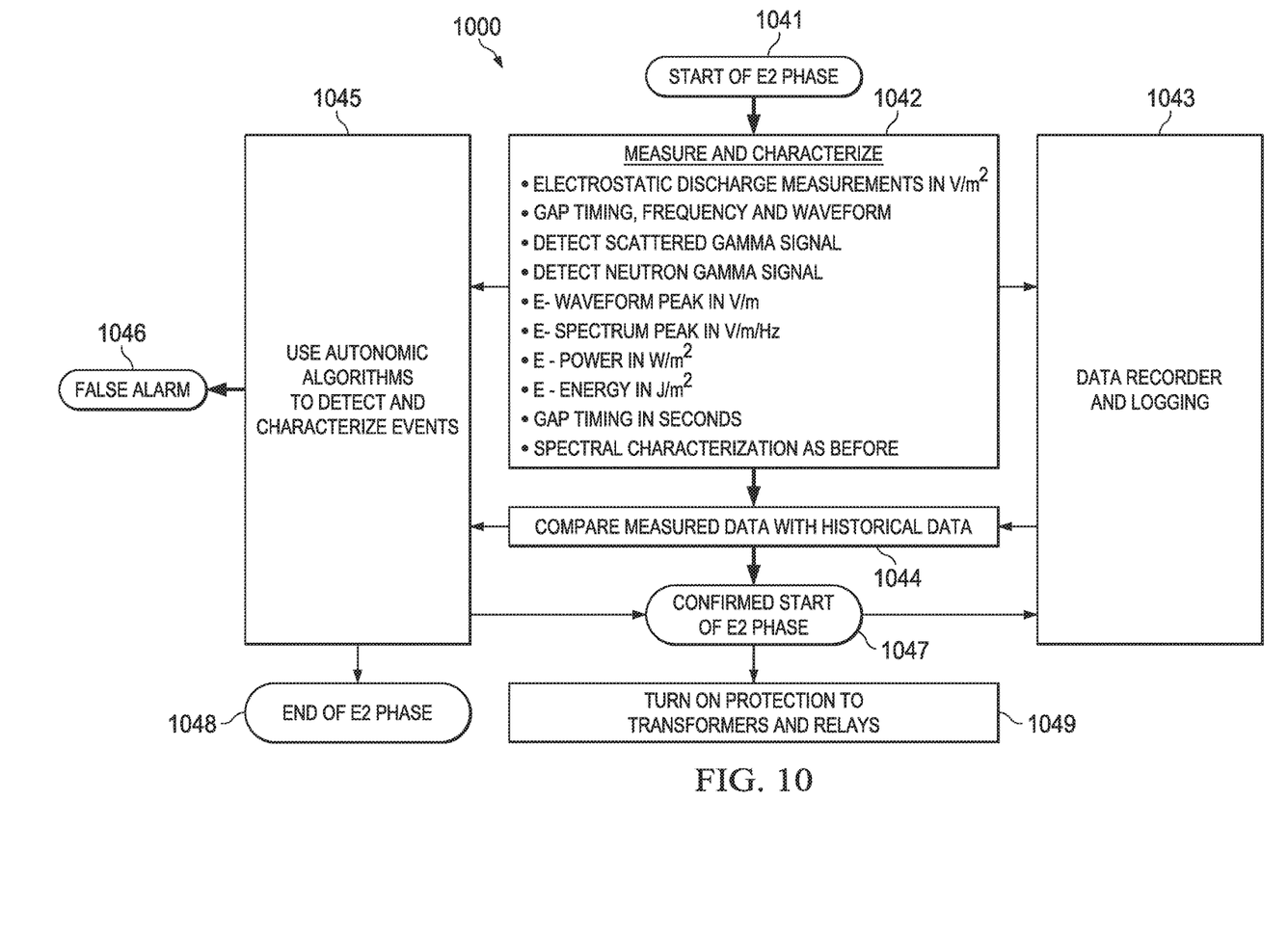
FIG. 10 illustrates an operation of the ECD subsystem in handling the E2 phase according to an embodiment of the disclosure.

FIG. 10 illustrates an operation 1000 of the ECD subsystem 220 in handling the E2 phase according to an embodiment of the disclosure. As shown, the operation 1000 involves the use of an E2 signal analysis unit 1042, an E2 data recording unit 1043, an E2 signal comparator unit 1044, an E2 computing unit 1045, and an E2 asset protection command unit 1049.

FIG. 10 also shows a triggering sequence of certain events. The ECD subsystem 220 starts the E2 phase detection (1041) when the subsystem 220 detects the end of the E1 phase. The E2 phase begins when the E1 phase ends. When the E2 phase begins, the ECD subsystem 220 commands certain sensors of the EMP sensor subsystem 210 to sense various waveform characteristics at various frequencies that are characteristics of the E2 phase. In one illustrative embodiment, the ECD subsystem 220 can tune the sensors to monitor in the frequency band of 1 KHz to 10 MHz. Various waveform characteristics are monitored by the signal analysis unit 1042, such as the peak V/m of the E waveform, the E spectrum peak in V/m/Hz, the waveform power peak in W/m, the spectrum peak power in W/m/Hz, the total energy in J/m2, the rise time to peak and duration of peak, the full pulse width at half maximum in nanoseconds, and the pulse width and spectrum bandwidth. The ECD subsystem 220, while continuing to measure these waveform characteristics, also provides the E2 data to the E2 data recording unit 1043, which turns on the recording of key parameters. In some systems, one data logging unit can serve all three phases. The ECD subsystem 220 then commands the E2 comparator unit 1044 to compare the current sensor data with historical data supplied by the recording unit and with preprogrammed E2 parameter limits. The results of comparisons are passed on to the E2 computing unit 1045, which uses monotonic and polytonic predicate calculus and autonomic algorithms to detect and characterize various events. These autonomic algorithms use historical data to analyze and detect signal characteristics with simulated and measured historical data and self-refine them with time based on true positives and false positives. When a false positive is detected, the ECD subsystem 220 signals an E2 false alarm (1046). If the ECD subsystem 220 detects a true E2 event, it confirms the start of the E2 event (1047). When the ECD subsystem 220 detects the end of the E2 phase, it signals that the E2 phase has ended (1048) and starts the E3 phase. A confirmed start of the E2 phase also turns on the process to activate asset protection systems in the E2 AP command unit 1049.

Figure 11:
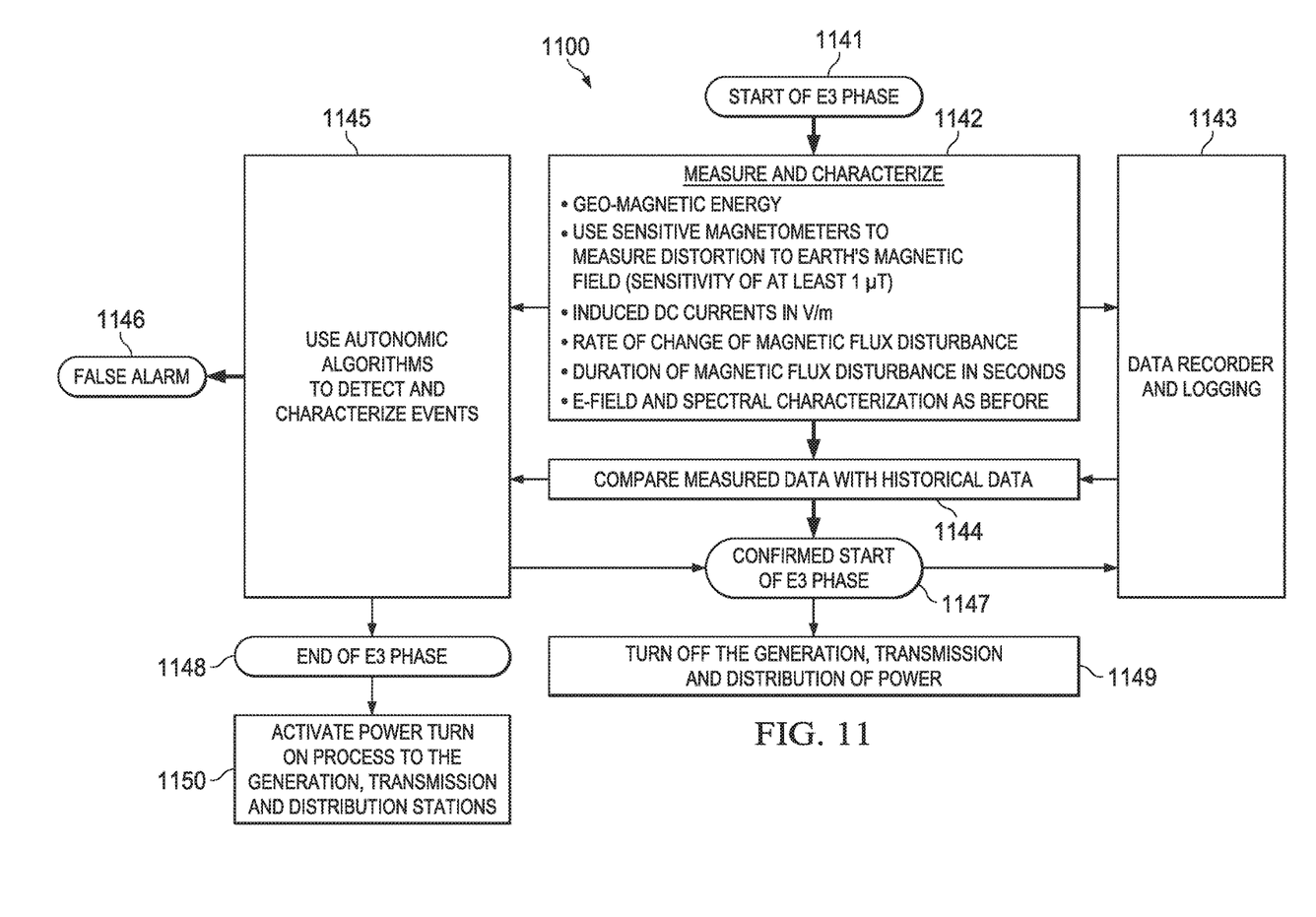
FIG. 11 illustrates the operation of the ECD subsystem handling the E3 phase according to an embodiment of the disclosure.

A similar set of events and interactions take place for the E3 phase. Note that each phase will focus on certain characteristics of energy and magnetic waveforms in certain frequency bands and the Earth's magnetic field and activate certain sensors as described earlier.

As shown in FIG. 11, an operation 1100 involves the use of an E3 signal analysis unit 1142, an E3 data logging unit 1143, an E3 signal comparator unit 1144, an E3 computing unit 1145 and an E3 asset protection command unit 1149.

FIG. 11 also shows a triggering sequence of certain events. The ECD subsystem 220 starts the E3 phase (1141) when it detects the end of the E2 phase. The E3 phase begins when the E2 phase ends. When the E3 phase begins, the ECD subsystem 220 commands certain sensors of the EMP sensor subsystem 210 to sense various magnetic and electric waveform characteristics at various frequencies that are characteristics of the E3 phase. In one illustrative embodiment, the ECD subsystem 220 can tune the sensors to monitor the rate of change of magnetic flux density and induced DC currents. Various waveform characteristics are monitored by the signal analysis unit 1142, such as magnetic flex densities, rate of change of magnetic flex densities, duration of change in flux densities, total induced electrical energy in J/m2, peak direct current potential, rise time to peak and duration of peak, and pulse width. The ECD subsystem 220, while continuing to measure these waveform characteristics, also provides the E3 data to the E3 data recorder and logging unit 1143, which turns on the recording of key parameters. The ECD subsystem 220 then commands the E3 comparator unit 1144 to compare current sensor data with historical data supplied by the recording unit and with preprogrammed E3 parameter limits. The results of comparisons are passed on to the E3 computing unit 1145, which uses monotonic and polytonic predicate calculus and autonomic algorithms to detect and characterize various events. These autonomic algorithms use historical data to analyze and detect signal characteristics with simulated and measured historical data and self-refine them with time based on true positives and false positives. When a false positive is detected, the ECD subsystem 220 signals an E3 false alarm (1146). If the ECD subsystem 220 detects a true E3 event, the subsystem 220 confirms the start of the E3 event (1147). A confirmed start of the E3 phase also turns on the processes of the E3 asset protection command unit 1049, which may include sending messages to the E3 portions of the AP subsystem 230. When the ECD subsystem 220 detects the end of the E3 phase, it signals that the E3 phase has ended (1148) and commands the command unit 1150 to start the awakening process to get the critical assets back on line.

It should be noted that one or more of these functional units can be combined and performed in a single resource, and this disclosure anticipates such combining of resources. For example, the E1 data recording unit 943 can be combined with the E2 data recording unit 1043 and the E3 data recording unit 1143. Such combinations of computing resources for all three phases can be done in a similar fashion.

Figure 12:
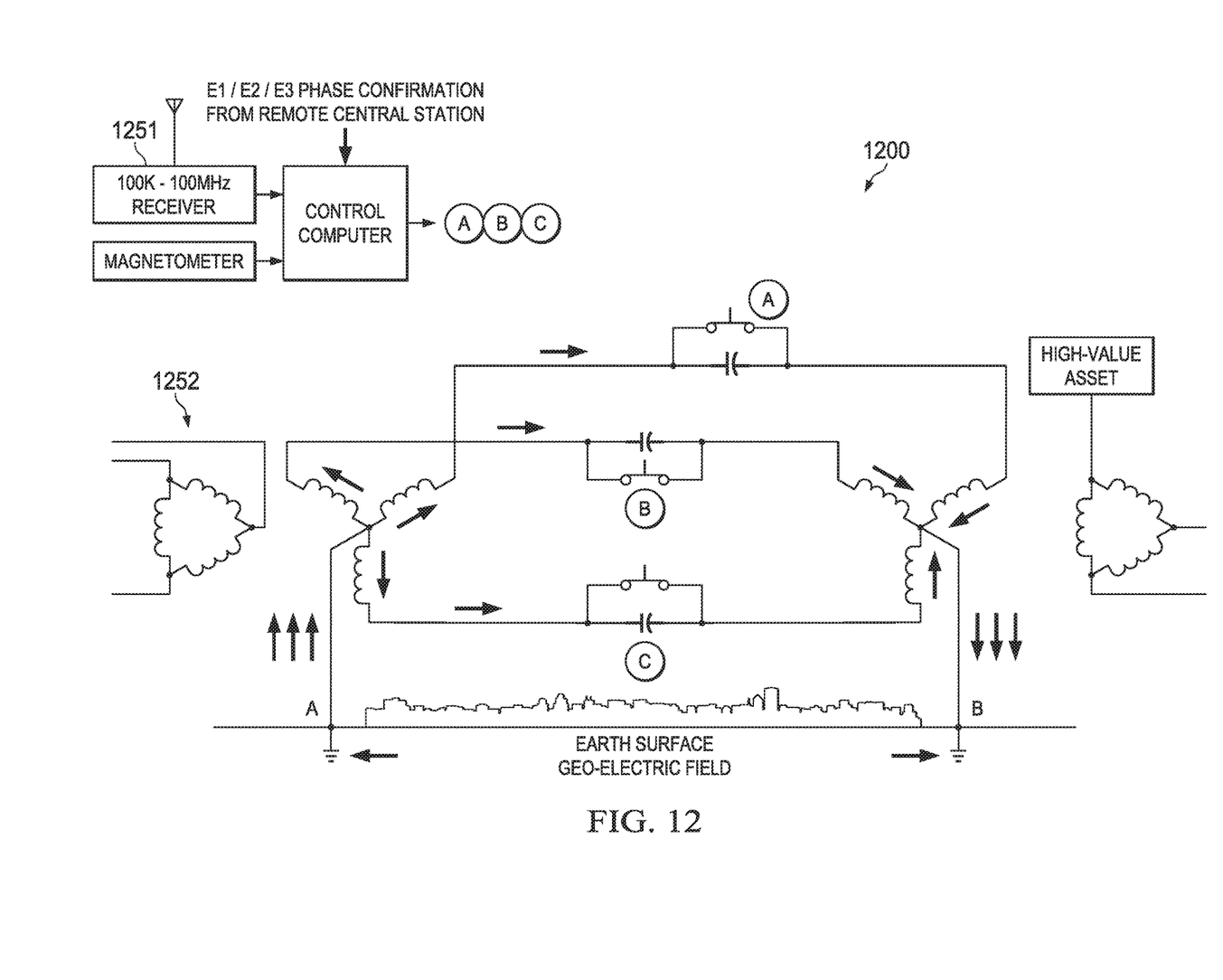
FIG. 12 illustrates how an AP subsystem can be implemented in a distributed architecture.

FIG. 12 illustrates how the AP subsystem 230 can be implemented in a distributed architecture. The AP subsystem 230 can be made as an integral part of field units that house critical infrastructure components. An example configuration 1200 is illustrated in FIG. 12. The configuration 1200 of FIG. 12 includes a field control module 1251 and a modified critical asset 1252. The field control module 1251 has an RF sensor, a magnetometer and a control computer as shown in FIG. 12. The control module 1251 is programmed to start to go into the protected mode and activate protection circuits when it detects the start of an E1 phase of a catastrophic event, as sensed by the RF sensors and the magnetometer and analyzed and confirmed by the microprocessor serving as the control computer. In one embodiment, the RF sensor is set to monitor the frequencies from 1 KHz to 300 MHz and sense a spike exceeding 5 KV/meter with a pulse width lasting for 20 to 30 ns. The magnetometer is set in one embodiment to detect rapid disturbances to the Earth's magnetic field and detect magnetic flux changing at a rate higher than 4000 nT per minute. The control computer can be programmed to analyze the inputs from the RF sensor and the magnetometer and confirm the occurrence of a catastrophic event as discussed earlier. The control computer (which may be part of the AP subsystem 230) sends out signals such as A, B and C to command the high-value asset to go into the protected mode.

The modified critical asset 1252 in FIG. 12 illustrates how a substation, which embodies high-value assets in the distribution and delivery of power, can be protected in the case of a catastrophic event. When the control module 1251 detects such an event and commands the asset to go into a protected mode, the high-value capacitors can be bypassed by bypass relays activated by command signals A, B and C. This will ground the spike in voltage due to the catastrophic event and protect the high-value capacitors and the transformer.

In another embodiment, a command signal can be delivered from a remote station as indicated in FIG. 12. There can be centralized EMP sensor subsystem 210 and ECD subsystem 220 that sense, analyze and detect the occurrence of a HEMP/CME/DEW event and command all field units to take the appropriate protective actions. The field assets may be commanded to start the shutdown process or just go into a protected mode as indicated in FIG. 12. In other embodiments, a combination of early detection in the field, such as the use of control module 1251, and a confirmation or release by the centralized EMP sensor subsystem 210 and ECD subsystem 220 can be used. There are various known techniques to protect a critical asset, and one skilled in the art will know how to use the output of the ECD subsystem described in this disclosure to actuate the protective measures. Variations of the techniques discussed here are anticipated by this disclosure, as one skilled in the art can use the inventive techniques taught in this disclosure and create variations there from.

Modifications, additions, or omissions may be made to the systems, apparatuses, and methods described herein without departing from the scope of the disclosure. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. An early detection system to detect an electromagnetic pulse event comprising:
   one or more radio frequency (RF) sensor units;
   one or more electrostatic sensor units;

one or more geomagnetic sensor units;
one or more direct current sensor units; and
an event detection subsystem configured to:
  receive and analyze sensor data from the one or more RF sensor units, the one or more electrostatic sensor units, the one or more direct current sensor units and the one or more geomagnetic sensor units; and
  detect an occurrence of the electromagnetic pulse event based on the sensor data received from the one or more RF sensor units, the one or more electrostatic sensor units, the one or more direct current sensor units and the one or more geomagnetic sensor units.

2. The early detection system of claim 1, further comprising:
a data repository and recording subsystem;
wherein the sensor data from the one or more RF sensor units, the one or more electrostatic sensor units, the one or more direct current sensor units, the one or more geomagnetic sensor units, and other data computed by the event detection subsystem that are associated with past electromagnetic pulse events are recorded and used to predict future electromagnetic pulse events.

3. The early detection system of claim 1, wherein:
the event detection subsystem is configured to use one or more autonomic algorithms; and
at least one of the one or more autonomic algorithms is configured to use signal characteristics from past electromagnetic pulse events to predict future electromagnetic pulse events.

4. The early detection system of claim 1, wherein at least one of the one or more RF sensor units is configured to detect electromagnetic energy having frequencies of 100 KHz through 1 GHz.

5. The early detection system of claim 1, wherein at least one of the one or more electrostatic sensor units is configured to detect electrostatic field potentials from 10 V/m$^2$ to 50,000 V/m$^2$.

6. The early detection system of claim 1, wherein at least one of the one or more geomagnetic sensor units has magnetometers with a sensitivity of 1 µT or better.

7. The early detection system of claim 1, wherein at least one of the one or more direct current sensor units is configured to detect induced currents exceeding 1,000 Amps or electric potentials exceeding 5,000 Volts due to changing magnetic fields.

8. The early detection system of claim 1, wherein the event detection subsystem is configured to measure a time duration of radio frequency, electrical, electrostatic and magnetic pulses that vary from nano-seconds to hundreds of seconds.

9. The early detection system of claim 1, wherein the event detection subsystem is configured to use sensor data from a combination of simulated and actual electromagnetic pulse events and monotonic and polytonic predicate calculus to predict a future occurrence of the electromagnetic pulse event.

10. The early detection system of claim 1, wherein the event detection subsystem is configured to detect one or more of: electromagnetic pulses generated by a detonation of a nuclear weapon, electromagnetic pulses generated by geomagnetic storms, or electromagnetic pulses generated by effects of directed energy weapons.

11. A critical infrastructure protection system comprising:
an electromagnetic pulse sensor subsystem comprising one or more radio frequency (RF) sensor units, one or more one or more electrostatic sensor units, one or more direct current sensor units and one or more geomagnetic sensor units;
an asset protection subsystem; and
an event detection subsystem configured to:
  receive and analyze sensor data from the one or more RF sensor units, the one or more electrostatic sensor units, the one or more direct current sensor units and the one or more geomagnetic sensor units;
  detect an occurrence of an electromagnetic pulse event based on the sensor data received from the one or more RF sensor units, the one or more electrostatic sensor units, the one or more direct current sensor units and the one or more geomagnetic sensor units; and
  command the asset protection subsystem to go into a protected mode to mitigate or eliminate potential damage from the electromagnetic pulse event.

12. The critical infrastructure protection system of claim 11, further comprising:
a data repository and recording subsystem;
wherein the sensor data from the one or more RF sensor units, the one or more electrostatic sensor units, the one or more direct current sensor units, the one or more geomagnetic sensor units, and other data computed by the event detection subsystem that are associated with past electromagnetic pulse events are recorded and used to predict future electromagnetic pulse events.

13. The critical infrastructure protection system of claim 11, wherein the event detection subsystem is configured to use one or more autonomic algorithms and monotonic or polytonic predicate calculus, at least one of the one or more autonomic algorithms or the monotonic or polytonic predicate calculus configured to use data from past electromagnetic pulse events to predict future electromagnetic pulse events.

14. The critical infrastructure protection system of claim 11, wherein at least one of the one or more RF sensor units is configured to detect electromagnetic energy having frequencies of 10 KHz through 1 GHz.

15. The critical infrastructure protection system of claim 11, wherein at least one of the one or more electrostatic sensor units is configured to detect electrostatic field potentials from 10 V/m$^2$ to 50,000 V/m$^2$.

16. The critical infrastructure protection system of claim 11, wherein at least one of the one or more geomagnetic sensor units has magnetometers with a sensitivity of 1 µT or better.

17. The critical infrastructure protection system of claim 11, wherein at least one of the one or more direct current sensor units is configured to sense direct currents with a minimum sensitivity of 1,000 VDC and currents exceeding 100 Amps.

18. The critical infrastructure protection system of claim 11, wherein at least one of the electromagnetic pulse sensor subsystem, the event detection subsystem and the asset protection subsystem is distributed from a site of assets that are being protected.

19. A method of protecting critical infrastructure components comprising:
receiving data from one or more radio frequency (RF) sensor units at an event detection subsystem;
receiving data from one or more electrostatic sensor units at the event detection subsystem;
receiving data from one or more geomagnetic sensor units at the event detection subsystem; and analyzing the data received from the one or more RF sensor units, the one or more electrostatic sensor units and the one or more geomagnetic sensor units to detect an electromagnetic pulse event.

20. The method of claim 19, further comprising:

recording, for past electromagnetic pulse events, the data received from the one or more RF sensor units, the one or more electrostatic sensor units and the one or more geomagnetic sensor units in a data repository and recording subsystem; and predicting future electromagnetic pulse events based on the recorded data for the past electromagnetic pulse events.

21. The method of claim 20, wherein predicting the future electromagnetic pulse events based on the recorded data for the past electromagnetic pulse events is at least partially carried out using an autonomic algorithm that uses signal characteristics from the past electromagnetic pulse events to predict the future electromagnetic pulse events.

\* \* \* \* \*